United States Patent
Chiu et al.

(10) Patent No.: US 8,222,114 B2
(45) Date of Patent: Jul. 17, 2012

(54) MANUFACTURING APPROACH FOR COLLECTOR AND A BURIED LAYER OF BIPOLAR TRANSISTOR

(75) Inventors: Tzuyin Chiu, Shanghai (CN); TungYuan Chu, Shanghai (CN); YungChieh Fan, Shanghai (CN); Wensheng Qian, Shanghai (CN); Fan Chen, Shanghai (CN); Jiong Xu, Shanghai (CN); Haifang Zhang, Shanghai (CN)

(73) Assignee: Shanghai Hua Hong NEC Electronics Company, Limited, Shanghai (CN)

( * ) Notice: Subject to any disclaimer, the term of this patent is extended or adjusted under 35 U.S.C. 154(b) by 0 days.

(21) Appl. No.: 12/979,907

(22) Filed: Dec. 28, 2010

(65) Prior Publication Data

US 2011/0159659 A1 Jun. 30, 2011

(30) Foreign Application Priority Data

Dec. 31, 2009 (CN) .......................... 2009 1 0202069

(51) Int. Cl.
*H01L 21/331* (2006.01)
*H01L 21/22* (2006.01)
(52) U.S. Cl. ........ 438/318; 438/352; 438/359; 438/378; 438/545; 257/E29.034; 257/E29.114; 257/E21.537
(58) Field of Classification Search .................. 438/318, 438/343, 352, 359, 378, 524, 527, 545, 795; 257/E29.034, E29.114, E21.537
See application file for complete search history.

(56) References Cited

U.S. PATENT DOCUMENTS

| | | | | |
|---|---|---|---|---|
| 2001/0005029 A1* | 6/2001 | Kanamori | ...................... | 257/315 |
| 2006/0268139 A1* | 11/2006 | Kobayashi et al. | ........... | 348/294 |
| 2007/0264787 A1* | 11/2007 | Dunn et al. | .................... | 438/321 |
| 2011/0140239 A1* | 6/2011 | Chiu et al. | ..................... | 257/565 |
| 2011/0147793 A1* | 6/2011 | Chiu et al. | ..................... | 257/156 |
| 2011/0147892 A1* | 6/2011 | Chiu et al. | ..................... | 257/565 |

OTHER PUBLICATIONS

U.S. Appl. No. 12/505,591, filed Jan. 21, 2010, Shanghai Hua Hong NEC Electronics.
U.S. Appl. No. 12/505,599, filed Jan. 21, 2010, Shanghai Hua Hong NEC Electronics.
U.S. Appl. No. 12/501,435, filed Jan. 21, 2010, Shanghai Hua Hong NEC Electronics.
U.S. Appl. No. 12/978,552, filed Jun. 30, 2011, Shanghai Hua Hong NEC Electronics.
U.S. Appl. No. 12/963,242, filed Jun. 16, 2011, Shanghai Hua Hong NEC Electronics.
U.S. Appl. No. 12/960,065, filed Jun. 9, 2011, Shanghai Hua Hong NEC Electronics.
U.S. Appl. No. 12/958,080, filed Jun. 9, 2011, Shanghai Hua Hong NEC Electronics.
U.S. Appl. No. 12/960,133, filed Jun. 9, 2011, Shanghai Hua Hong NEC Electronics.
U.S. Appl. No. 12/966,078, filed Jun. 16, 2011, Shanghai Hua Hong NEC Electronics.

(Continued)

*Primary Examiner* — Kevin Parendo
(74) *Attorney, Agent, or Firm* — Ming Chow; Sinorica, LLC

(57) ABSTRACT

This invention disclosed a novel manufacturing approach of collector and buried layer of a bipolar transistor. One aspect of the invention is that an oxide-nitride-oxide (ONO) sandwich structure is employed instead of oxide-nitride dual layer structure before trench etching. Another aspect is, through the formation of silicon oxide spacer in trench sidewall and silicon oxide remaining in trench bottom in the deposition and etch back process, the new structure hard mask can effectively protect active region from impurity implanted in ion implantation process.

6 Claims, 10 Drawing Sheets

OTHER PUBLICATIONS

U.S. Appl. No. 12/966,241, filed Jun. 23, 2011, Shanghai Hua Hong NEC Electronics.
U.S. Appl. No. 12/975,545, filed Jun. 30, 2011, Shanghai Hua Hong NEC Electronics.
U.S. Appl. No. 12/960,166, filed Jun. 9, 2011, Shanghai Hua Hong NEC Electronics.
U.S. Appl. No. 12/979,674, filed Jun. 30, 2011, Shanghai Hua Hong NEC Electronics.
U.S. Appl. No. 12/979,802, filed Jun. 30, 2011, Shanghai Hua Hong NEC Electronics.
U.S. Appl. No. 12/979,999, filed Jun. 30, 2011, Shanghai Hua Hong NEC Electronics.
U.S. Appl. No. 12/505,591, filed Jul. 20, 2009, Shanghai Hua Hong NEC Electronic.
U.S. Appl. No. 12/505,599, filed Jul. 20, 2009, Shanghai Hua Hong NEC Electronic.
U.S. Appl. No. 12/501,435, filed Jul. 12, 2009, Shanghai Hua Hong NEC Electronic.
U.S. Appl. No. 12/978,552, filed Dec. 25, 2010, Shanghai Hua Hong NEC Electronic.
U.S. Appl. No. 12/963,242, filed Dec. 8, 2010, Shanghai Hua Hong NEC Electronic.
U.S. Appl. No. 12/960,065, filed Dec. 3, 2010, Shanghai Hua Hong NEC Electronic.
U.S. Appl. No. 12/958,080, filed Dec. 1, 2010, Shanghai Hua Hong NEC Electronic.
U.S. Appl. No. 12/960,133, filed Dec. 3, 2010, Shanghai Hua Hong NEC Electronic.
U.S. Appl. No. 12/966,078, filed Dec. 13, 2010, Shanghai Hua Hong NEC Electronic.
U.S. Appl. No. 12/966,241, filed Dec. 13, 2010, Shanghai Hua Hong NEC Electronic.
U.S. Appl. No. 12/975,545, filed Dec. 22, 2010, Shanghai Hua Hong NEC Electronic.
U.S. Appl. No. 12/960,166, filed Dec. 3, 2010, Shanghai Hua Hong NEC Electronic.
U.S. Appl. No. 12/979,674, filed Dec. 28, 2010, Shanghai Hua Hong NEC Electronic.
U.S. Appl. No. 12/979,802, filed Dec. 28, 2010, Shanghai Hua Hong NEC Electronic.

* cited by examiner

MANUFACTURING APPROACH FOR COLLECTOR AND A BURIED LAYER OF BIPOLAR TRANSISTOR

The current invention claims a foreign priority to application China 200910202069.1 filed on Dec. 31, 2009.

FIELD OF THE INVENTION

This invention belongs to one type of bipolar transistor (BJT). More particularly it relates to one type of collector of a bipolar transistor.

BACKGROUND OF THE INVENTION

A conventional bipolar transistor is illustrated in FIG. 1. PNP bipolar transistor has same structure as NPN bipolar transistor, with only reverse impurity type of every parts of the device. NPN bipolar transistor is illustrated here as example. N type heavily doped region 11 is above p type substrate 10. N type epitaxy layer 12 (doping level is lower than buried layer 11, normally medium to low doped) is above heavily doped n buried layer 11. There are a few shallow trench isolation (STI) structures 13a/13b/13c/13d among n type epitaxy layer 12. The bottom of these STI is in contact of buried layer 11. N type heavily doped region 14 exists between STI 13a/13b or 13c/13d inside epitaxy layer 12, which is used as collector pick up (sinker). P type base 15 is on top of n type epitaxy layer 12. Base 15 is a semiconductor material, such as silicon, silicon germanium alloy, etc. It is connected to base pick up B. Heavily doped emitter poly 16 is on top of base 15. It is connected to pick up E. In all, n type emitter 16, p type base 15, n type epitaxy layer 12 and n type buried layer 11 formed NPN bipolar transistor vertically.

In bipolar transistor illustrated in FIG. 1, n type epitaxy layer 12 between STI 13b and 13c is collector of the bipolar transistor. The collector is picked up to C through n type heavily doped buried layer 11 (collector buried layer) and n type heavily doped sinker 14. The collector buried layer area is large by this approach. Consequently the parasitic capacitance with substrate is also large. A deep trench isolation structure 130a/130d is commonly formed under STI 13a/13d to enclose entire bipolar transistor periphery. Deep trench isolation structure 130a/130d extend through n type heavily doped buried layer 11 until inside p type substrate 10. It cuts through n type heavily doped layer 11, in order to reduce junction area of collector buried layer to p type substrate 10, and reduce parasitic capacitance between them.

FIG. 1 is only illustration of a bipolar transistor. There may be variations of each portion during real manufacturing.

Following process steps are normally adopted for collector and buried layer of above mentioned bipolar transistor:

Step 1: n type impurity is ion implanted into p type substrate. The commonly used n type impurity is Phosphorus (P), Arsenic (As), Antimony, etc. N type heavily doped buried layer 11, also called collector buried layer, is formed then.

Step 2: N type epitaxy layer 12 is grown (deposit one layer of n type single crystal 12) on top of n type heavily doped buried layer 11. The doping level of 12 is lower than heavily doped buried layer 11.

Step 3: Shallow trench was etched inside silicon. The depth of shallow trench is normally below 2 um. The position of shallow trench is shown in FIG. 1 as 13a/13b/13c/13d.

A deep trench is then etched at the bottom of STI which encloses entire bipolar transistor. The depth of deep trench is normally more than Tum. The position of deep trench is indicated as 130a/130d in FIG. 1.

Dielectric such as polysilicon is then filled into deep trench. Deep trench isolation structure 130a/130d is formed.

Shallow trench is also filled with dielectric such as silicon oxide. The shallow trench isolation structure 13a/13b/13c/13d is formed.

N type epitaxy layer 12 between STI 13b/13c is the collector region. There are a few disadvantages of the approach that forms collector and buried layer of bipolar transistor. First, the cost of growing n type single crystal 12 on top of silicon substrate 12 is high. Second, the depth of deep trench isolation structure 130a/130d is more than 7 um, etch and fill in process are complex and expensive.

SUMMARY OF THE INVENTION

It is therefore an object of the present invention to offer a manufacturing approach of collector and buried layer of one type of bipolar transistor. No process of buried layer and epitaxy is required. Following process steps are included in the manufacturing approach of collector and buried layer of bipolar transistor:

Step 1, an ONO(oxide-nitride-oxide) structure hard mask is deposited on the silicon substrate surface, and then shallow trench isolation (STI) is adopted. The shallow trenches 20a and 20b is etched in silicon substrate 20. The depth of the trench is less than 2 um.

The ONO hard mask 30 mentioned above includes isolation oxide layer 30a in bottom, silicon nitride 30b in middle and silicon oxide 30c on top.

Step 2, a silicon oxide film 31 is deposited on wafer surface. Then this oxide film 31 is etched back to the ONO hard mask. Now, a silicon oxide spacer is shaped in the sidewall of the shallow trenches 20a and 20b. Some silicon oxide will remain at the bottom of shallow trenches 20a and 20b.

Step 3, the bottom of STI 20a and 20b mentioned above is doped with impurity by ion implantation. A doped region 21a and 21b in the substrate 20 is formed near the bottom of above stated STI 20a and 20b.

Step 4, the oxide 30c, 31a and 31b is stripped by wet etch.

Step 5, dielectric is filled into above stated shallow trenches 20a and 20b. Shallow trench isolation 22a and 22b is then formed.

Step 6, the wafers undergo high temperature anneal process. Highly doped area 21a and 21b mentioned above links between STI 22a and 22b through lateral diffusion. Pseudo buried layer 21 is formed. The pseudo buried layer 21 is collector buried layer of above stated bipolar transistor.

Step 7, the silicon substrate between STI 22a and 22b and above pseudo buried layer goes through single or multiple ion implantation. The above mentioned active region 20 is converted into doped region 23. The dope concentration should be lower than that of pseudo buried layer 21.

The doped region 23 is the collector of the bipolar transistor.

BRIEF DESCRIPTION OF THE DRAWINGS

The foregoing and the object, features, and advantages of the invention will be apparent from the following detailed description of the invention, as illustrated in the accompanying drawings, in which.

EXPLANATION OF THE LABELS

10: P type substrate; 11: N type heavily doped buried layer;
12: N type epitaxy layer; 13a/13b/13c/13d: Shallow trench isolation structure
130a/130d: Deep trench isolation; 14: N type heavily doped region;
15: Base; 16: Emitter;
20: Silicon substrate; 20a/20b: Shallow trench;
21a/21b: Doped zone; 21: Pseudo buried layer;
22a/22b: Shallow trench isolation structure; 23: Doped region.
C: Collector pick up; B: Base pick up; E: Emitter pick up;

DETAILED DESCRIPTION OF THE INVENTION

Figure 2:
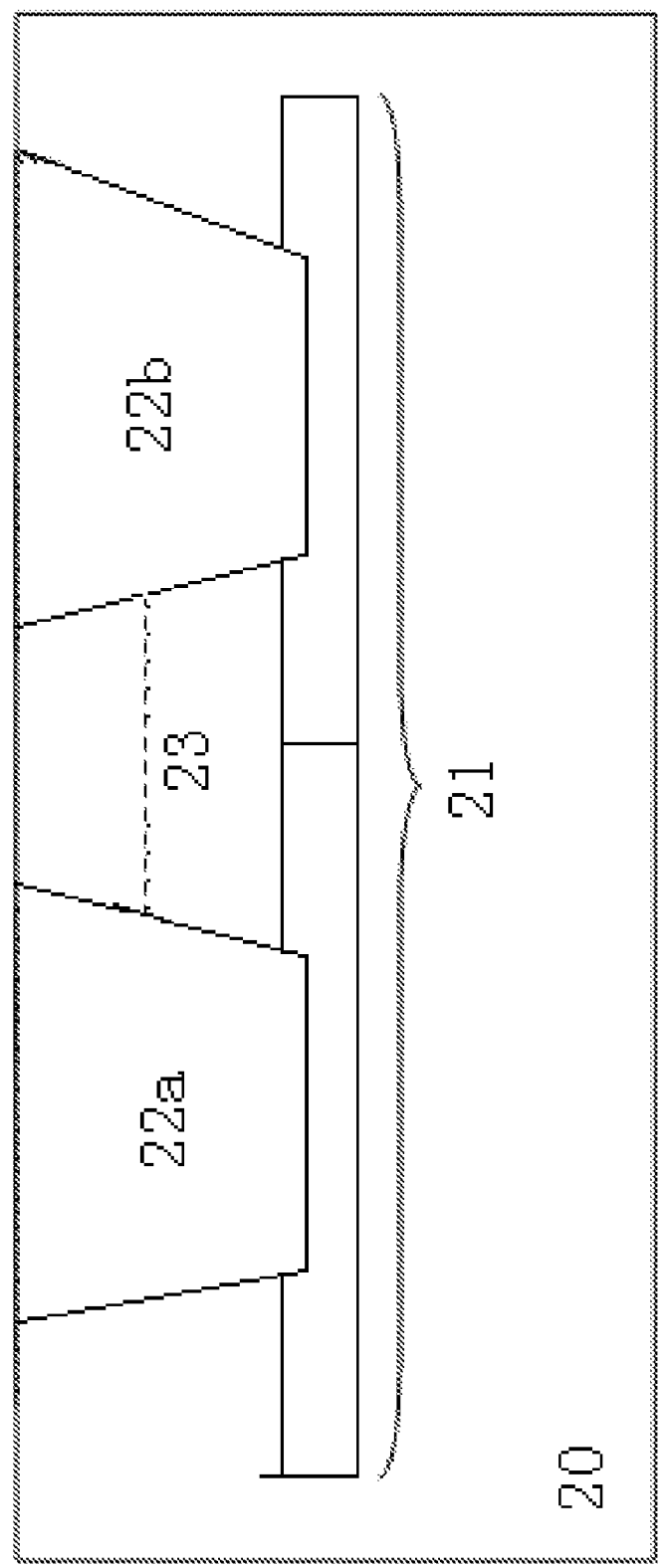
FIG. 2 is collector and buried layer of present invented bipolar transistor.

Refer to FIG. 2, silicon substrate 20 of present invented bipolar transistor includes:

Shallow trench isolation structure 22a/22b, the active region between shallow trench isolation region 22a/22b is the collector of bipolar transistor.

Pseudo buried layer 21, lies at the bottom of STI region 22a/22b, is continuous between 22a/22b (merge together instead of two separate regions). Above stated pseudo buried layer is the collector buried layer of the bipolar transistor.

Doped region 23 is the active region between STI 22a/22b and above pseudo buried layer 21. The doping level of 23 is less than that of pseudo buried layer 21. Doped region 23 is the collector of bipolar transistor.

For NPN bipolar transistor, above stated substrate 10 is p type. Pseudo buried layer 21 and doped region 23 are all n type. For PNP bipolar transistor, above stated substrate 10 is n type. Pseudo buried layer 21 and doped region 23 are all p type.

Figure 1:
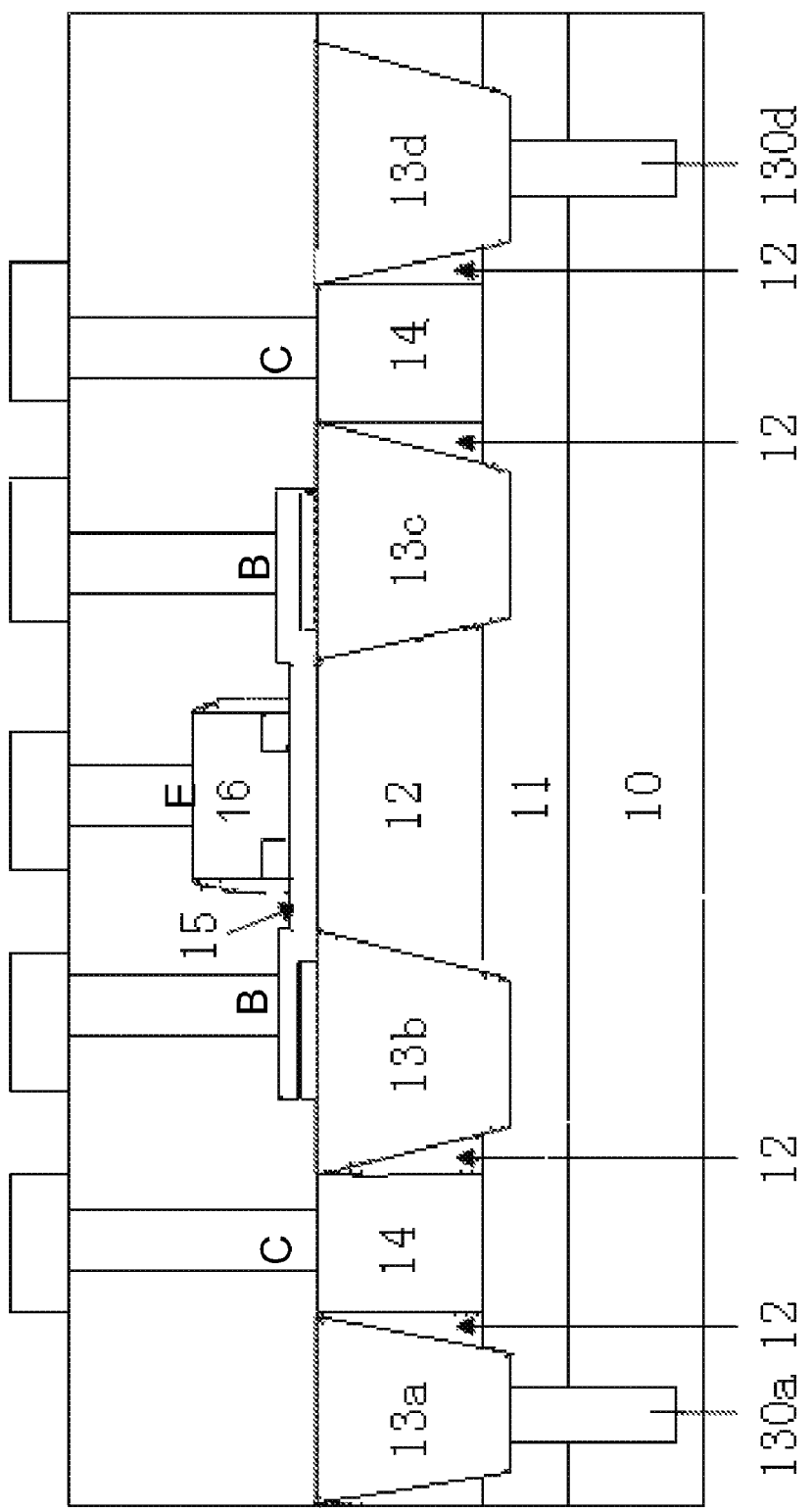
FIG. 1 is conventional bipolar transistor structure cross section view;.

As indicated in FIG. 1, conventional buried layer 11 is formed by ion implantation to silicon substrate before epitaxy growth, the area is big. It is necessary to use deep trench isolation structure 130a/130d to divide buried layer 11 in order to reduce parasitic capacitance. Present invented pseudo buried layer 21 as indicated in FIG. 2 is formed by ion implantation and high temperature anneal after shallow trench etch, the area is small. It is un-necessary to use deep trench structure in subsequent process. In other hand, doped region 23 is used to replace epitaxy layer 12. Above invention not only simplify the device structure and manufacturing approach, but also conserve the manufacturing cost.

Figure 3A:
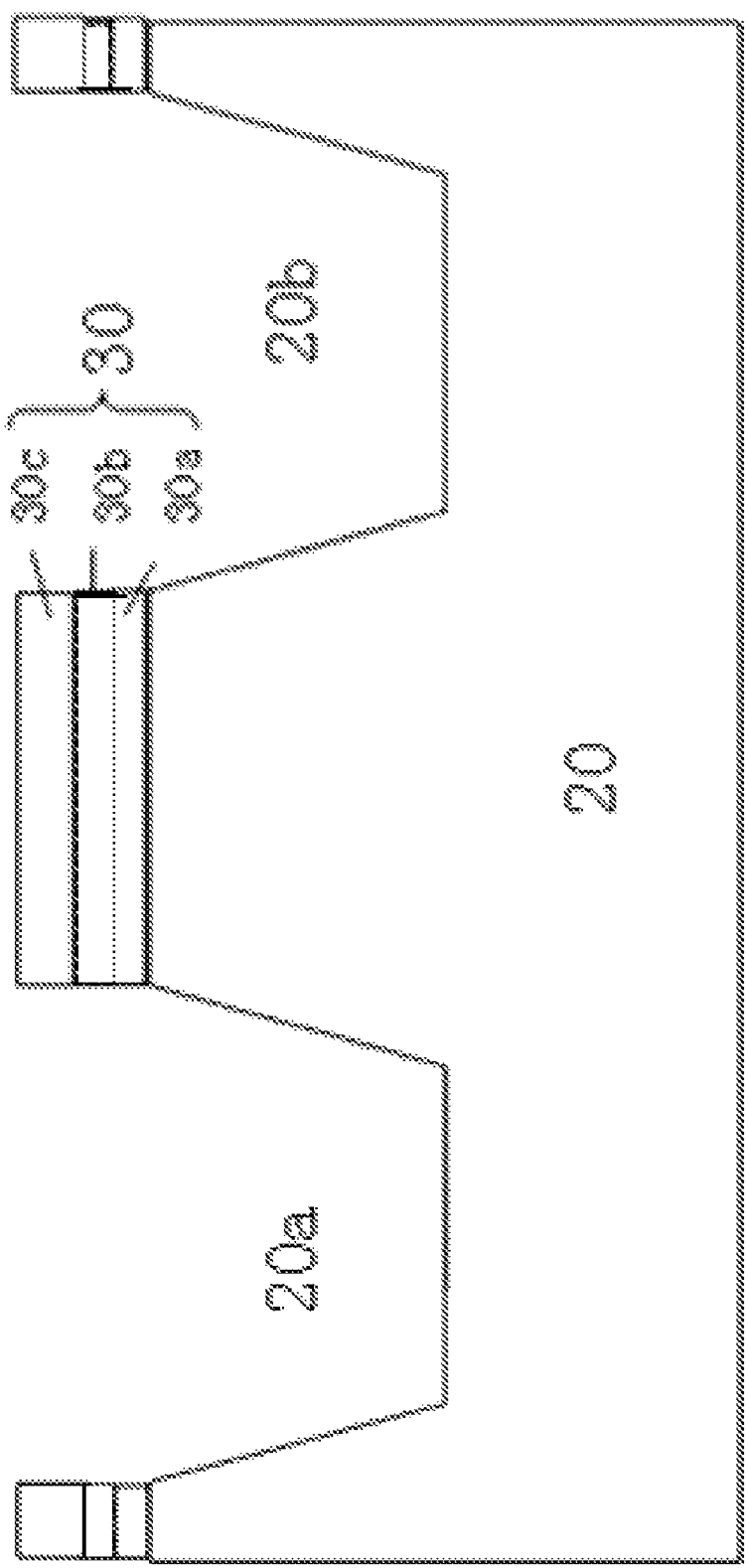
FIGS. 3a~3g are step by step illustration of manufacturing approach of collector and buried layer of present invented bipolar transistor.

Following process steps have been included to make the collector of the bipolar transistor indicated in FIG. 2:

Step 1: refer to FIG. 3a, an ONO hard mask is deposited on silicon substrate, shallow trench 20a/20b is etched using STI process. The depth of the trench is less than 2 um. This step further includes:

In step 1.1, thin silicon oxide (SiO$_2$) layer is grown thermally on silicon surface. This SiO$_2$ layer is called pad oxide. It is used to protect active region from chemical contamination when silicon nitride (Si$_3$N$_4$) is removed in subsequent process.

In step 1.2, a silicon nitride (Si$_3$N$_4$) thin film is deposited on silicon surface. Si$_3$N$_4$ is a hard dielectric material used here as hard mask. It is used to protect the active region when perform STI dielectric fill-in and use as a stop layer in subsequent chemical-mechanical polish (CMP) process.

In step 1.3, a thin film of SiO$_2$ is deposited on silicon surface. The thickness is 300-800 A. The SiO$_2$ 30a, Si$_3$N$_4$ 30b, and SiO$_2$ 30c forms ONO hard mask 30.

In step 1.4, photo resist is spin coated on silicon surface, followed by exposure and develop step. An etch window is exposed.

In step 1.5, the hard mask in exposed window is etched away, together with part of silicon substrate. Shallow trench 20a 20b is formed.

Figure 3B:
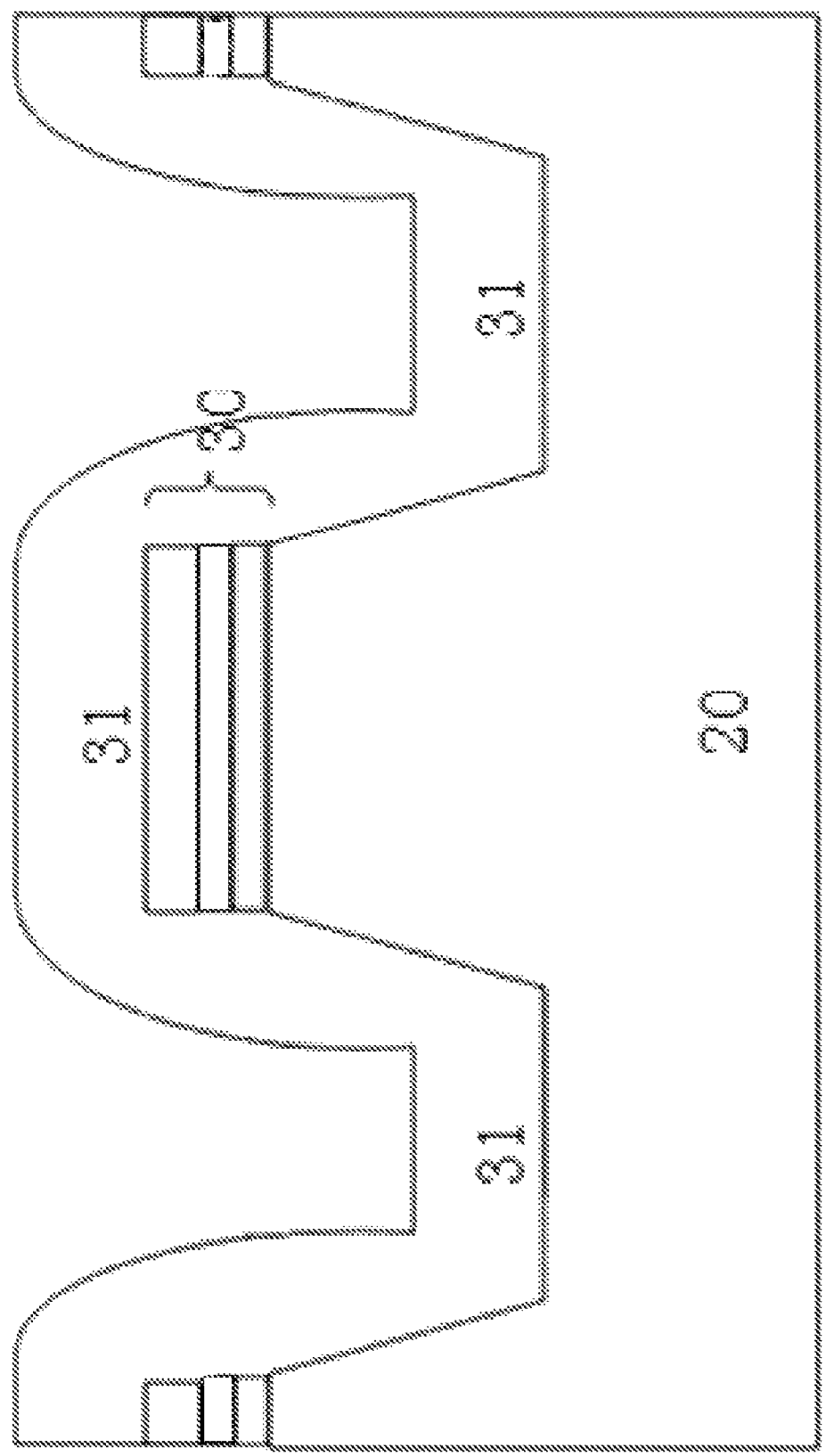
Figure 3C:
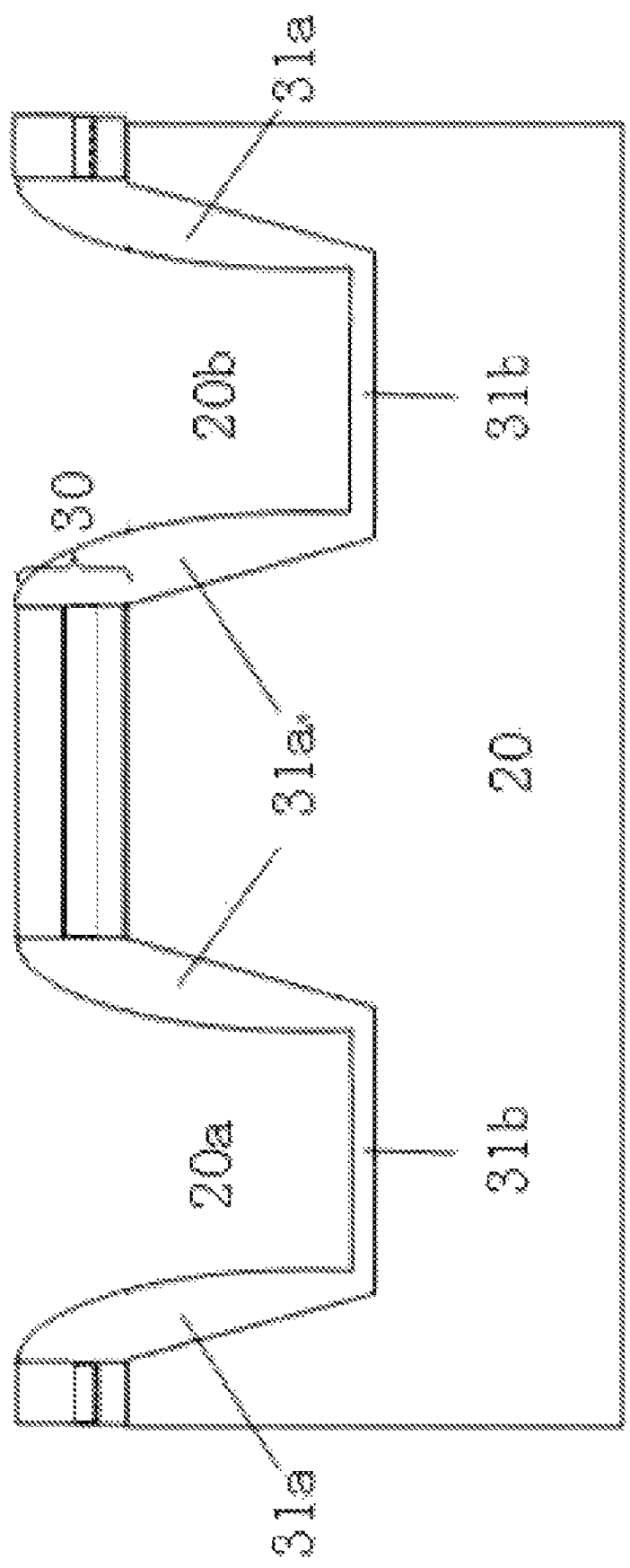

Step 2: refer to FIG. 3b, a silicon oxide film 31 is deposited on wafer surface, then this oxide film 31 is etched back to the ONO hard mask. Silicon oxide spacer is shaped in the sidewall of the shallow trenches 20a and 20b mentioned above. Some silicon oxide will be remained on the bottom of shallow trenches 20a and 20b, as shown in FIG. 3c.

It is a common practice that, after shallow trench is etched, a thermal grown oxide is grown on shallow trench sidewall and bottom. This silicon oxide calls liner oxide. It is used to improve the interface characteristics between shallow trench silicon and the dielectric filled. This liner oxide is very thin which have no impact to ion implantation. Also there is no indication in FIG. 3b, FIG. 3c and other figures.

Figure 3D:
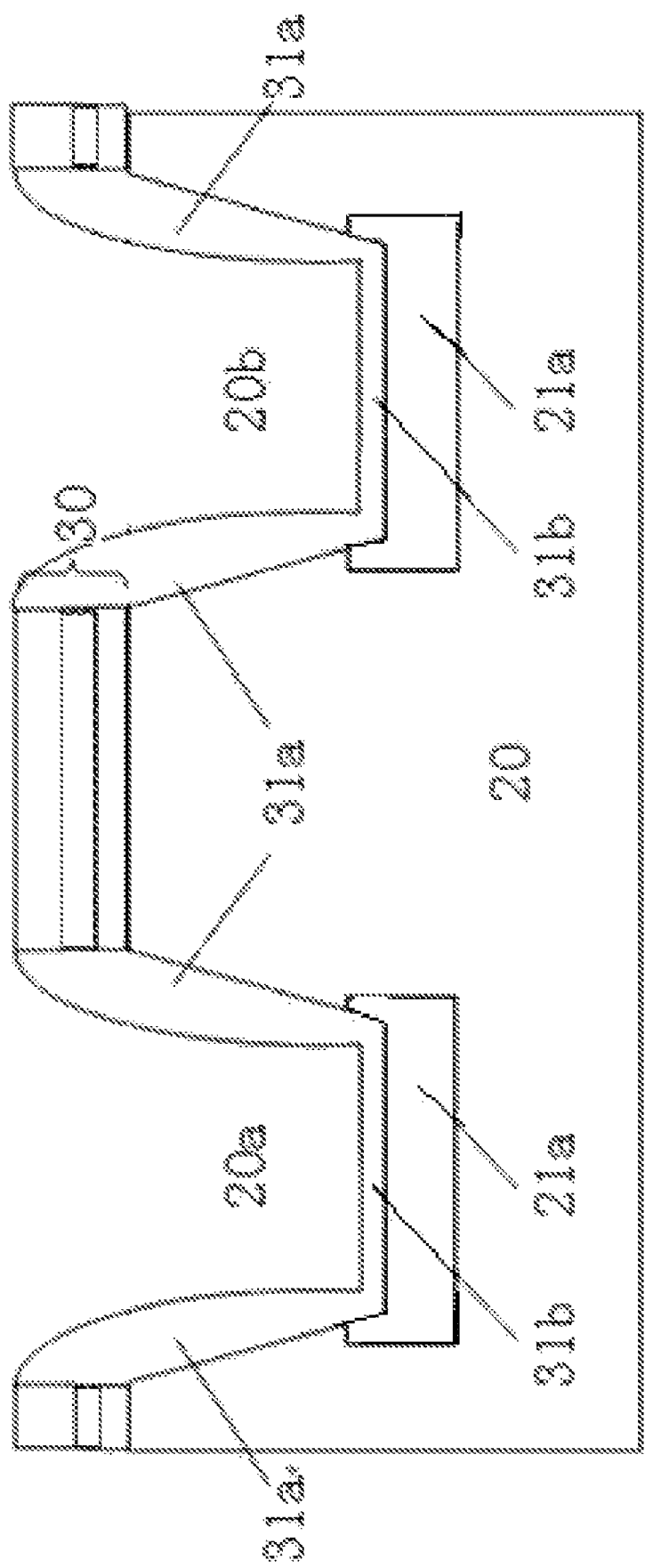

Step 3: refer to FIG. 3d, the bottom of STI 20a/20b is doped with impurity by high dose, low energy ion implant. High doped regions 21a 21b are then formed near the bottom of STI 20a 20b in substrate 20.

There is ONO hard mask 30 on silicon substrate surface 20, and silicon oxide spacer 31a on sidewall of STI 20a/20b, ion implant is stopped to penetrate to active region below ONO hard mask 30 and active region below sidewall of STI 20a/20b.

Figure 3E:
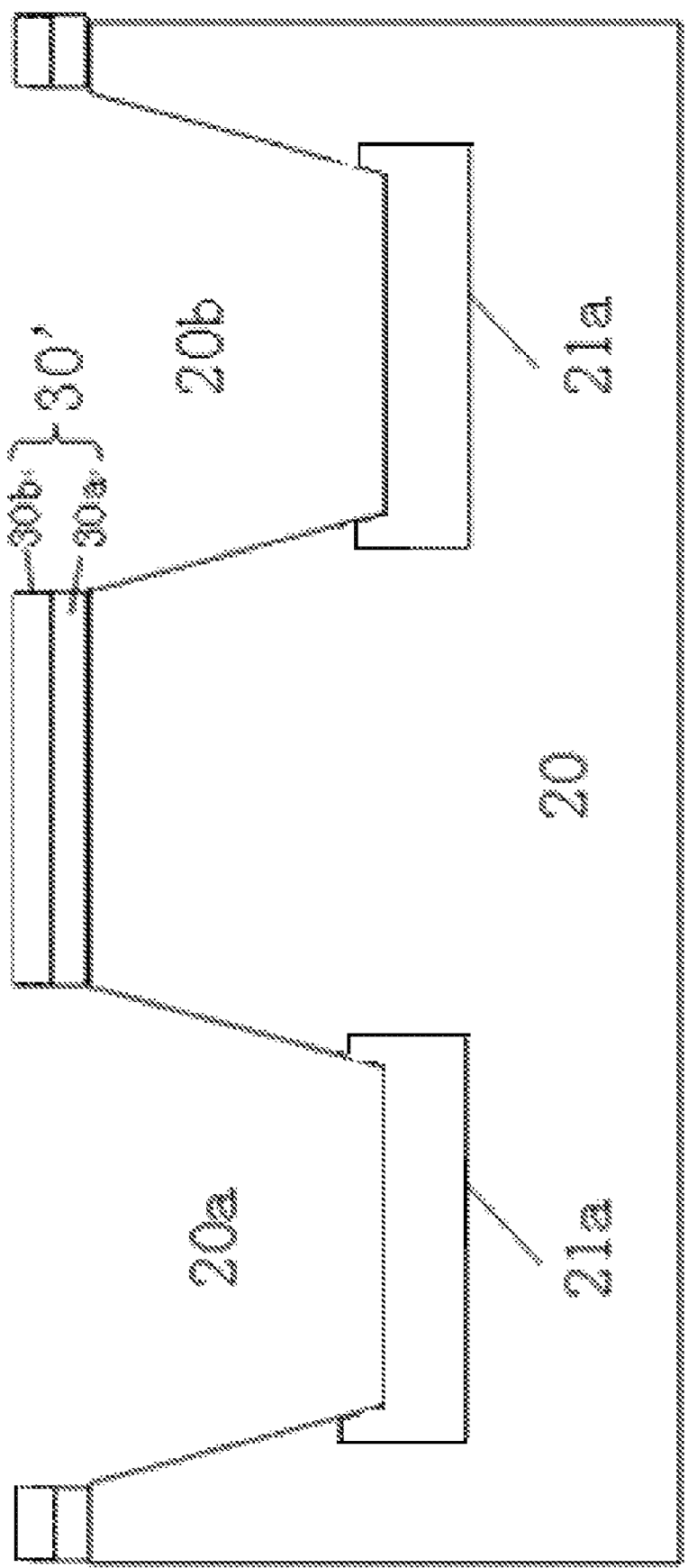

Step 4, refer to FIG. 3e, silicon oxide is removed by wet etch. The oxide includes 30c above hard mask 30, 31a on sidewall of STI 20a/20b, 31b at bottom of STI 20a/20b. After silicon oxide is removed from silicon surface, the hard mask remained on silicon surface includes bottom silicon oxide 30a and silicon nitride 30b dual layers.

Figure 3F:
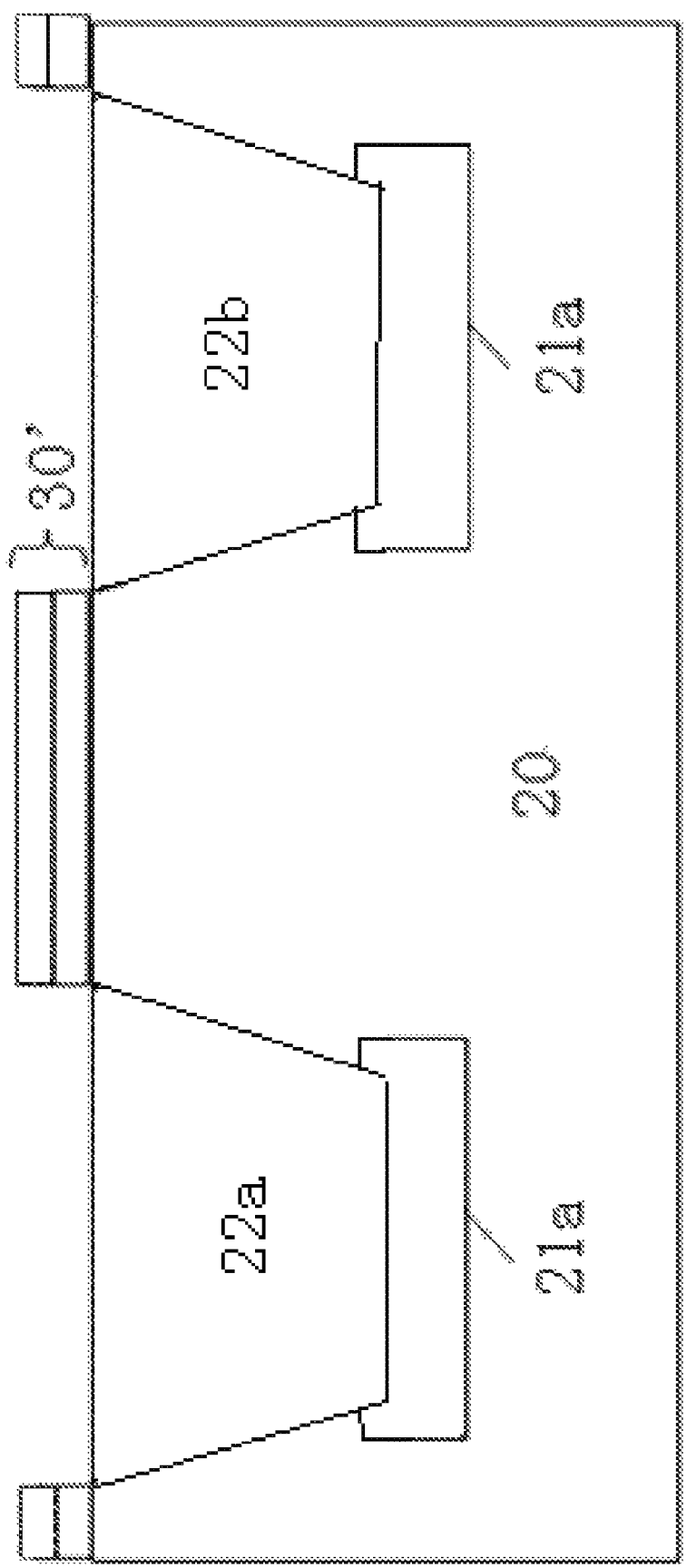

Step 5, refer to FIG. 3f, dielectric is filled into above stated shallow trenches 20a/20b. Shallow trench isolation 22a and 22b is then formed.

The process in forming STI also includes:
Step 5.1, a layer of dielectric such as silicon oxide is filled in. The dielectric should at least fill in shallow trench fully.
Step 5.2, silicon wafer is polished using chemical-mechanical polish process. The filled dielectric should be in same height as silicon top surface.
Step 5.3, Si$_3$N$_4$ is removed by wet etch process.

Figure 3G:
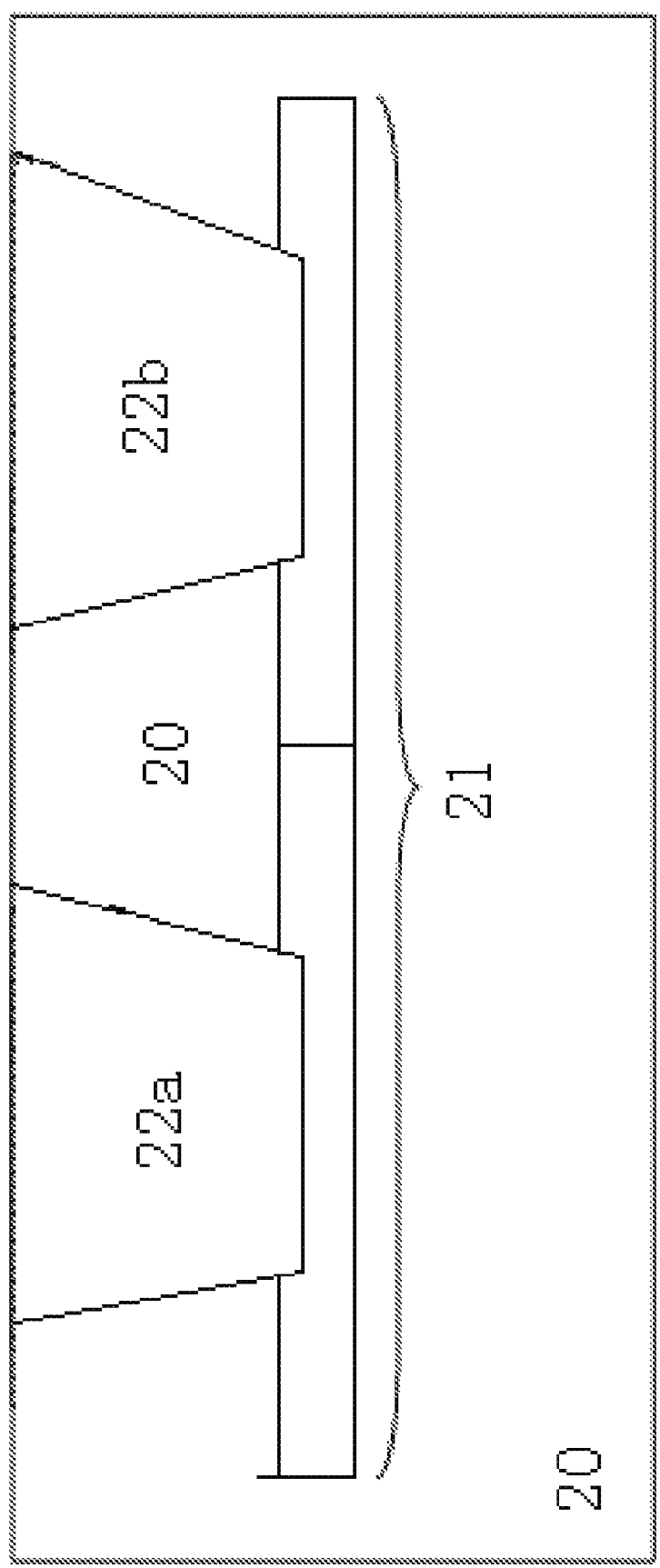

Step 6, refer to FIG. 3g, thermal anneal process is carried out for the wafer, two heavily doped regions 21a/21b diffuse laterally and vertically. The lateral diffusion results in link of two heavily doped region 21a/21b between shallow trench isolation structure 22a/22b. Pseudo buried layer 21 is then formed. The n type heavily doped region 21 is the collector buried layer of whole bipolar transistor.

In FIG. 3g, as main part (Si$_3$N$_4$ deposited in step 1.2) of hard mask 30 is removed, hard mask is no longer illustrated in FIG. 3g. The pad oxide grown in step 1.1 is not shown in FIG. 3g as it is too thin.

Step 7, the silicon substrate between STI 22a and 22b and above pseudo buried layer goes through single or multiple ion implantation. The above mentioned active region 20 is converted into doped region 23. The dope concentration should below that of pseudo buried layer 21.

For NPN bipolar transistor, in step 1, silicon substrate 20 is p type. In step 3, n type impurity is implanted, heavily doped n type regions 21a/21b are formed. In step 6, n type heavily doped pseudo buried layer 21 is formed. In step 7, n type impurity is implanted and n type doped region 23 is formed;

For PNP bipolar transistor, in step 1, silicon substrate 20 is n type. In step 3, p type impurity is implanted, heavily doped n type regions 21a/21b are formed. In step 6, p type heavily doped pseudo buried layer 21 is formed. In step 7, p type impurity is implanted and p type doped region 23 is formed;

In above mentioned step 3, ion implant is carried out in high dose, low energy method. The so called high dose, for Phosphorous, Arsenic, Antimony, Titanium, Indium, the ion dose is $1\times10^{14}$~$1\times10^{16}$ per square centimeter. For Boron, Boron Fluoride, the ion dose is $10^{13}$~$1\times10^{16}$ per square centimeter. The low energy stated above means ion implant energy is less than 30 keV.

In above mentioned step 6, the best choice of thermal anneal process is rapid thermal anneal (RTA) process.

In above mentioned step 6, ion implant is conducted in medium to low dose. The so called medium to low dose means the ion dosage is less than $1\times10^{14}$ atoms per square centimeter (or ions per square centimeter).

In conventional shallow trench isolation (STI) process, before shallow trench etch, a thin silicon oxide film is grown on silicon surface followed by a silicon nitride thin film deposition. This means the hard mask on silicon surface before shallow trench etch is consisted of bottom silicon oxide and top silicon nitride dual layers. In present invented shallow trench process, the hard mask before shallow trench etch is consisted of bottom silicon oxide, middle silicon nitride, and top silicon oxide triple layers.

In conventional shallow trench isolation (STI) process, only a liner oxide of thickness around 150 Å is grown at sidewall and bottom of shallow trench before shallow trench fill in. In STI process of present invention, a liner oxide is grown at sidewall and bottom of shallow trench before shallow trench fill in, followed by deposition of a thin silicon oxide layer, then an etch back is performed and an oxide spacer is formed on STI sidewall together with some oxide remain on STI bottom. The thickness of spacer and bottom oxide is much thicker than that of liner oxide, thus it can be used to stop ion penetration and protect the active region.

In above mentioned step 6, after thermal anneal process, it is possible that two high doped regions 21a/21b still can not link between STI 22a and 22b through lateral diffusion, instead they are two separate regions. For such circumstance, an improvement to collector of bipolar transistor is give by this invention. In above mentioned step 1, partial or full hard mask 30 on top of silicon substrate 20 between STI 20a/20b are removed by litho and etch process. In above mentioned step 3, silicon substrate 20 below had mask 30 and between STI 20a/20b is doped with ion impurity through heavy dose high energy ion implantation process. The so called high energy is, ion implant energy is above 30 keV, the higher projection is then obtained. Finally three doped regions exist in silicon substrate 20. It is the best that the three doped region have same depth. After such improvement, the three doped region can link together and form pseudo buried layer 21 through lateral diffusion after step 6 high temperature thermal anneal.

As to when to use this improved approach, it can be decided by TCAD simulation after detail manufacturing process is confirmed. TCAD simulation is first carried out with basic process (shown in FIG. 3a~FIG. 3b, and FIG. 2). If simulation indicates two heavily doped region 21a and 21b can not merge after high temperature anneal, then it is necessary to adopt one of the improved approach or a combination of improved approaches.

Figure 4:
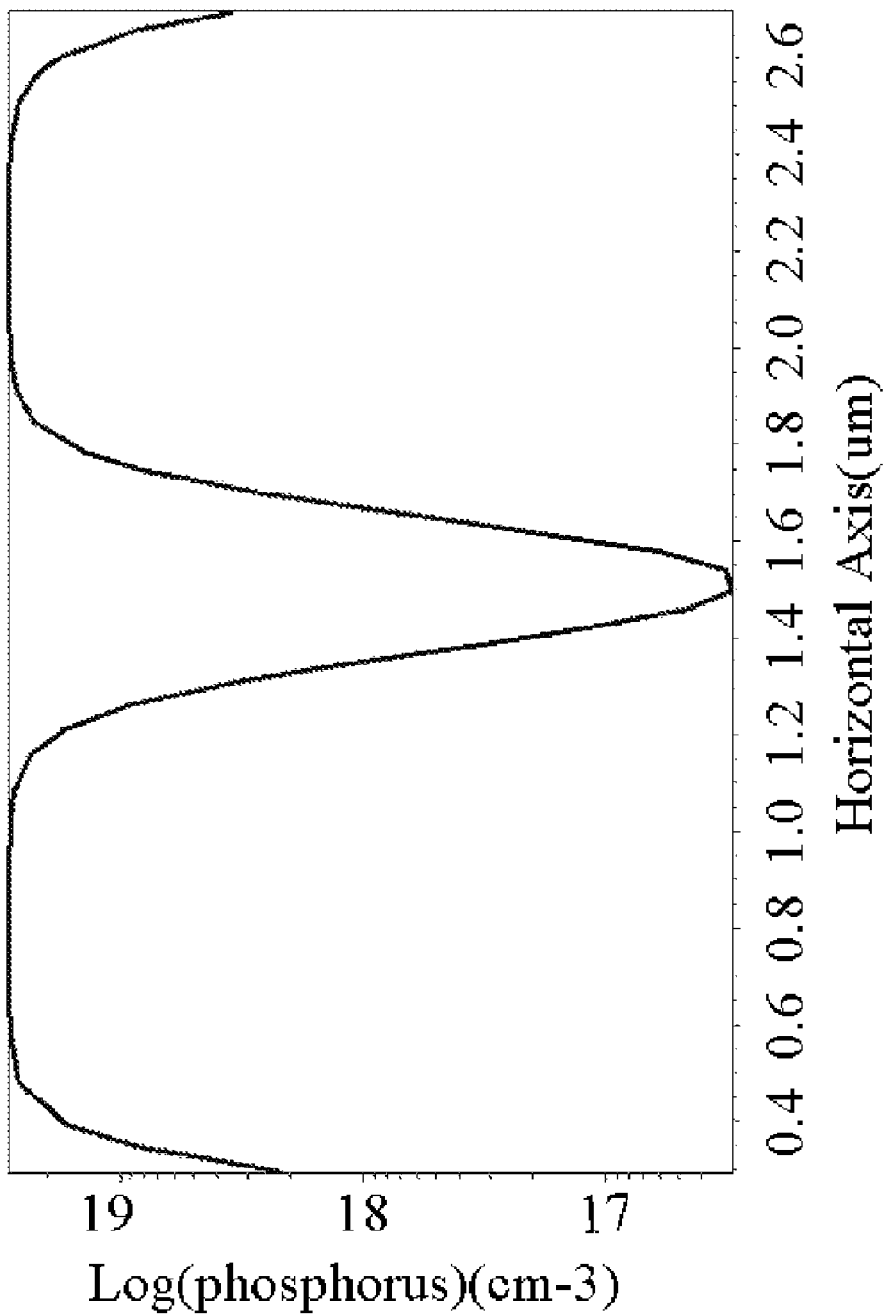
FIG. 4 presents an illustration of dopant concentration of collector buried layer of present invention.

Refer to FIG. 4, according to TCAD simulation of present invented bipolar transistor, the p type impurity across cross section A-A (collector buried layer) of FIG. 2 has a lowest concentration below base. Thus the up diffusion of the impurity to collector is low. It will not affect the breakdown voltage of collector to base of the bipolar transistor. Also, pseudo buried layer is with high dose low energy, the dopant concentration inside pseudo buried layer is high but the junction area is small, the junction capacitance of buried layer to substrate is low.

In present invention, the collector buried layer is picked up by a deep contact hole. The contact holes etch through two STI structures at both sides of active region then fill the hole with conduction material.

The invention claimed is:

1. A manufacturing process for a collector and a buried layer of a bipolar transistor, comprises:
    step 1, depositing an ONO (oxide nitride oxide) hard mask on a silicon substrate surface; etching shallow trenches on the silicon substrate, wherein the depth of the shallow trenches is less than 2 μm; wherein the ONO hard mask includes a silicon oxide ($SiO_2$) layer in the bottom, silicon nitride ($Si_3N_4$) in the middle and silicon oxide on the top;
    step 2, depositing a silicon oxide film on the ONO hard mask; etching back the oxide film thus forming a silicon oxide spacer is on sidewalls of the shallow trenches;
    step 3, doping the bottoms of shallow trenches with an impurity by ion implantation to form doped regions in the substrate near the bottom of the shallow trenches;
    step 4, stripping the silicon oxide film by wet etch;
    step 5, filling dielectric into the shallow trenches thus forming shallow trench isolations (STIs);
    step 6, annealing the silicon substrate with a temperature anneal process to link the doped regions between the STIs through lateral diffusion thus forming a pseudo buried layer;
    step 7, implanting the active region between the STIs and above the pseudo buried layer with one or more ion implantations; thus converting it into the collector.

2. The manufacturing process of claim 1 wherein a thickness of the bottom $SiO_2$ is between 100 and 300 Å, a thickness of the $Si_3N_4$ layer is between 200 and 500 Å, and a thickness of the top $SiO_2$ is between 300 and 800 Å.

3. The manufacturing process of claim 1 wherein in step 2, a width of the oxide spacer formed on the sidewall of STI is about 300-1000 Å.

4. The manufacturing process of claim 1 wherein either a NPN bipolar transistor or a PNP bipolar transistor is formed;
    wherein, if the NPN bipolar transistor is formed:
        in step 1, the silicon substrate is p-type;
        in step 3, the impurity is n-type and the doped regions are n-type;
        in step 6, the pseudo buried layer is n-type and is doped;
        in step 7, the one or more ion implantations are n-type and the collector is n-type;
    wherein, if the PNP bipolar transistor is formed;
        in step 1, the silicon substrate is n-type;
        in step 3, the impurity is p-type and the doped regions are p-type;
        in step 6, the pseudo buried layer is p-type and is doped;
        in step 7, the one or more ion implantations are p-type and the collector is p-type.

5. The manufacturing process of claim 1, wherein, in step 3, the ion implantation is carried out with a high ion dose and a low ion implant energy of less than 30 keV; wherein, if phosphorus, arsenic, antimony, titanium, or indium are implanted, the high ion dose is $1\times10^{14}$~$1\times10^{16}$ atoms per square centimeter, and if boron or boron fluoride is implanted, the high ion dose is $10^{13}$ ~$1\times10^{16}$ atoms per square centimeter.

6. The manufacturing process of claim 1, wherein, in step 7, the one or more ion implantations are conducted with a medium to low dose with an ion dose concentration of less than $1\times10^{14}$ atoms per square centimeter.

* * * * *